United States Patent [19]

Rao

[11] Patent Number: 4,574,465
[45] Date of Patent: Mar. 11, 1986

[54] DIFFERING FIELD OXIDE THICKNESSES IN DYNAMIC MEMORY DEVICE

[75] Inventor: G. R. Mohan Rao, Houston, Tex.

[73] Assignee: Texas Instruments Incorporated, Dallas, Tex.

[21] Appl. No.: 367,837

[22] Filed: Apr. 13, 1982

[51] Int. Cl.$^4$ .................. H01L 21/22; H01L 21/265
[52] U.S. Cl. .................................. 29/571; 29/576 B; 29/578; 148/1.5; 148/187; 148/DIG. 82; 357/51; 357/52; 357/91
[58] Field of Search ............... 29/571, 576 B, 578; 148/1.5, 187, DIG. 82; 357/91, 51, 52

[56] References Cited

U.S. PATENT DOCUMENTS

| | | | |
|---|---|---|---|
| 4,288,910 | 9/1981 | Heeren et al. | 29/571 |
| 4,326,331 | 4/1982 | Guterman | 29/571 |
| 4,334,236 | 6/1982 | Hoffmann et al. | 357/59 |
| 4,335,502 | 6/1982 | Richman | 29/571 |
| 4,352,236 | 10/1982 | McCollum | 29/571 |
| 4,384,895 | 5/1983 | Kuo | 29/571 |
| 4,391,032 | 7/1983 | Schulte | 29/571 |
| 4,434,543 | 3/1984 | Schwabe et al. | 29/576 B |
| 4,435,895 | 3/1984 | Parrillo et al. | 29/571 |

Primary Examiner—Upendra Roy
Attorney, Agent, or Firm—John G. Graham

[57] ABSTRACT

A dynamic read/write memory device using one-transistor N-channel silicon gate type cells is made by a double-level polysilicon process in which the field oxide is of reduced thickness for the cell array, and of conventional thickness for peripheral circuits. This reduces moat encroachment in the critical cell portion, yet does not force performance compromises in the critical speed paths.

17 Claims, 12 Drawing Figures

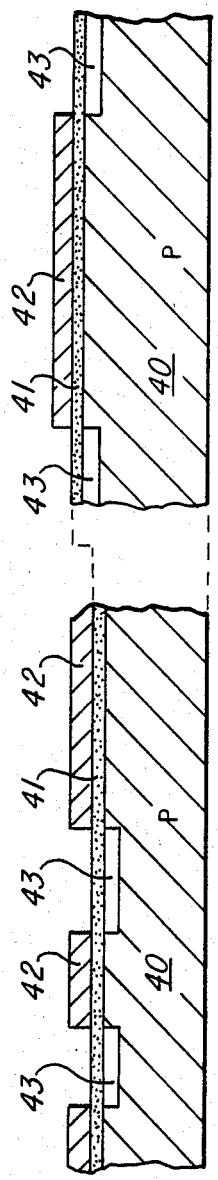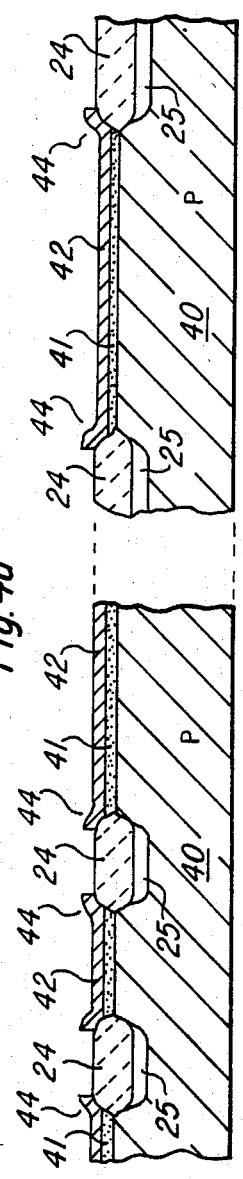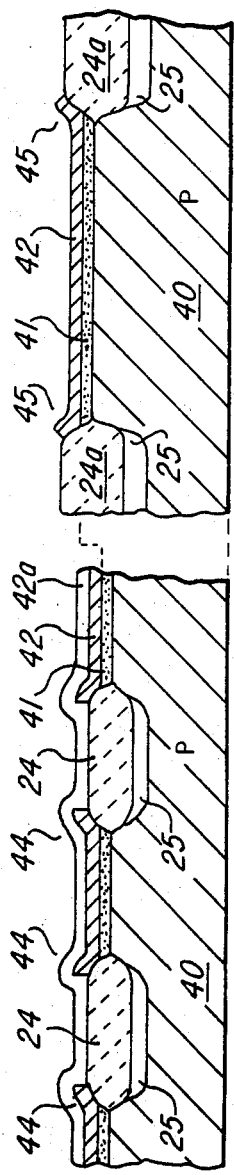

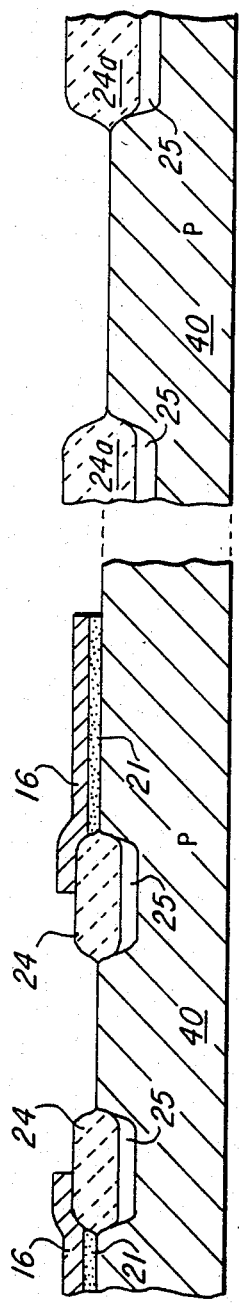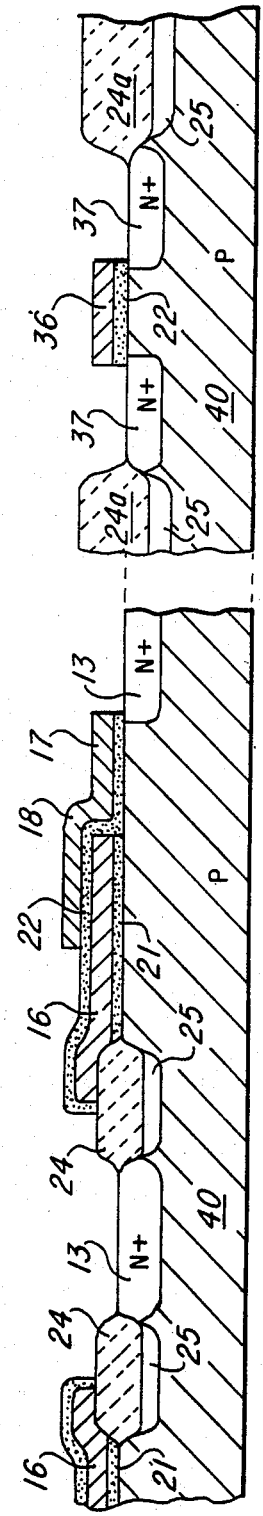
Fig. 4d
Fig. 4e

DIFFERING FIELD OXIDE THICKNESSES IN DYNAMIC MEMORY DEVICE

BACKGROUND OF THE INVENTION

This invention relates to semiconductor memory devices and methods of manufacture, and more particularly to an improved method for making one-transistor dynamic read/write memory devices of the N-channel silicon gate type.

Dynamic read/write memory devices made by the single-level or double-level polysilicon, N-channel, self-aligned processes commonly used in the industry are shown in my U.S. Pat. No. 4,055,444 and my pending application Ser. No. 132,703, filing date Mar. 21, 1980 as well as in U.S. Pat. No. 4,240,092, by C-K Kuo, all assigned to Texas Instruments; these processes are also shown in Electronics: Feb. 19, 1976, pp. 116-121; May 13, 1976, pp. 81-86; and Sept. 28, 1978, pp. 109-116.

In prior dynamic RAM devices, the cell array and peripheral circuitry is usually formed by a process which leaves thick field oxide surrounding MOS transistors of the silicon-gate, self-aligned type on the face of a silicon bar. The field oxide is created in a high-temperature operation using nitride as an oxidation mask; to reduce capacitance between overlying conductors and underlying heavily-doped silicon regions, the field oxide is thick, but the process of growing the oxide results in moat encroachment beneath the edges of the nitride. This is in a continuing problem in large arrays as the capacitor and transistor sizes are scaled down for maximum density.

It is the principal object of this invention to provide an improved high-speed, high-density, dynamic read/write memory device and method of making, particularly for minimizing problems caused by moat encroachment. Another object is to provide a dynamic memory device of reduced cell size yet high speed. An additional object is to provide a high density DRAM memory device, made by an improved method which provides a reduction in capacitance for the peripheral circuitry, compared to the cell array.

SUMMARY OF THE INVENTION

In accordance with an illustrative embodiment of the invention, a dynamic read/write memory device using one-transistor N-channel silicon gate type cells is made by a double-level polysilicon process in which the field oxide is of reduced thickness for the cell array, and of conventional thickness for peripheral circuits. This reduces moat encroachment in the critical cell portion, yet does not force performance compromises in the critical speed paths.

BRIEF DESCRIPTION OF THE DRAWINGS

The novel features believed characteristics of the invention are set forth in the appended claims. The invention itself, however, as well as other features and advantages thereof, will be best understood by reference to the detailed description which follows, read in conjunction with the accompanying drawings, wherein:

FIGS. 4a-4e are elevation views in section of the cell array of FIGS. 1 and 3a-3e, at successive stages in the manufacturing process, taken generally along the line a—a in FIG. 1.

DETAILED DESCRIPTION OF SPECIFIC EMBODIMENTS

Figure 1:
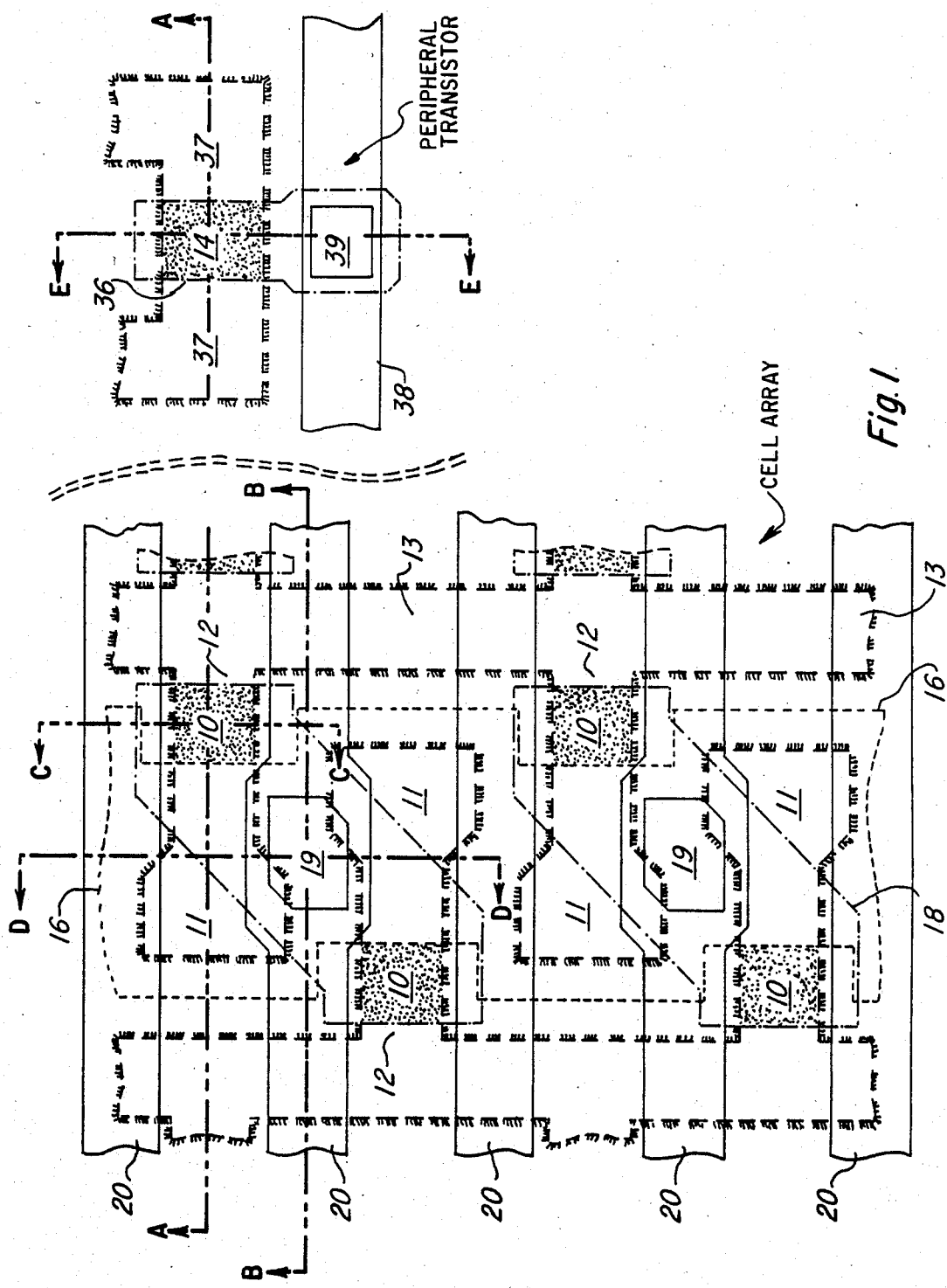
FIG. 1 is a greatly enlarged plan view of small portions of a semiconductor chip showing the physical layout of a part of a dynamic memory cell array and peripheral transistor which may be made according to the invention.

With reference to FIGS. 1, 2, and 3a-3e, an array of one-transistor dynamic memory cells and associated peripheral devices is illustrated which may be made according to the invention. Each memory cell includes an MOS access transistor 10 and an MOS capacitor 11. Each access transistor has an N+ source (or drain) region 12 which is part of one of a large number of elongated column or bit lines 13 formed by N+ diffused regions in the face of the silicon bar. A peripheral transistor 14 which is used in buffers, decoders, clock generators or the like is spaced laterally or separated from the cell array on the silicon bar. The capacitors 11 of the cell array include inverted regions 15 in the surface of the silicon created by a Vcc voltage, about 5 v, on first level polycrystalline silicon strips 16 which extend along the columns. The gates 17 of the access transistors 10 are formed by second level polycrystalline silicon segments 18, each of which forms gates for two of the transistors. The segments 18 extend over the first level polysilicon to provide contact areas 19 where connection is made to metal row or word lines 20. Each contact area 19 is shared by two cells. No contact area 19 is seen for alternate ones of the lines 20 in FIG. 1 since contact areas for such lines will be between the next pair of columns.

The first level polysilicon strips 16 are separated from the silicon in the area of the capacitors 15 by a gate insulator, usually a thin thermal oxide coating 21, and a similar gate insulator, again usually a silicon oxide coating 22, separates the gates 17 from the silicon at the transistors 10 and 14, as well as separating the remainder of the second level poly segments 18 from the first level poly. A thick layer 23 of low-temperature deposited oxide separates the polysilicon layers from the metal lines 20.

According to the invention, a layer of thermal "field" oxide 24 of a lesser thickness surrounds all of the moat areas in the cell array on the face of the silicon bar, whereas a thicker field oxide 24a surrounds all moat areas in the periphery, such as surrounding the transistor 14; that is, all areas not occupied by the transistors 10, capacitors 11 and bit lines 13 are covered by thin field oxide 24 in the cell array portion of the silicon bar, while like areas in the periphery are covered by thicker field oxide 24a.

Channel stop regions 25 underlying all of the field oxide 24 or 24a are doped P+ at a level which will eliminate or reduce unwanted inversions, as is the usual practice.

Figure 2:
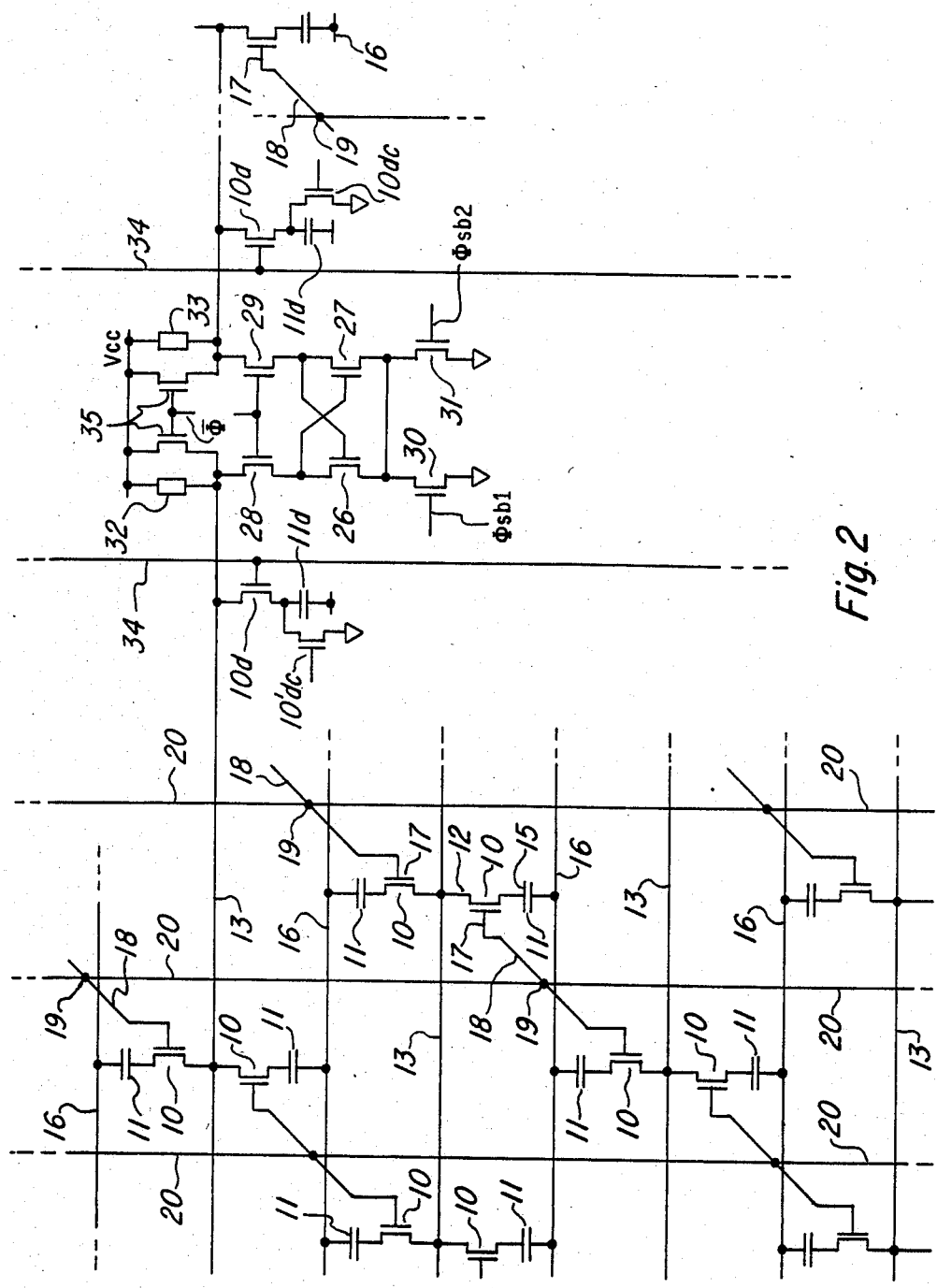
FIG. 2 is an electrical schematic diagram of the part of the cell array of FIG. 1.
Figure 3A:
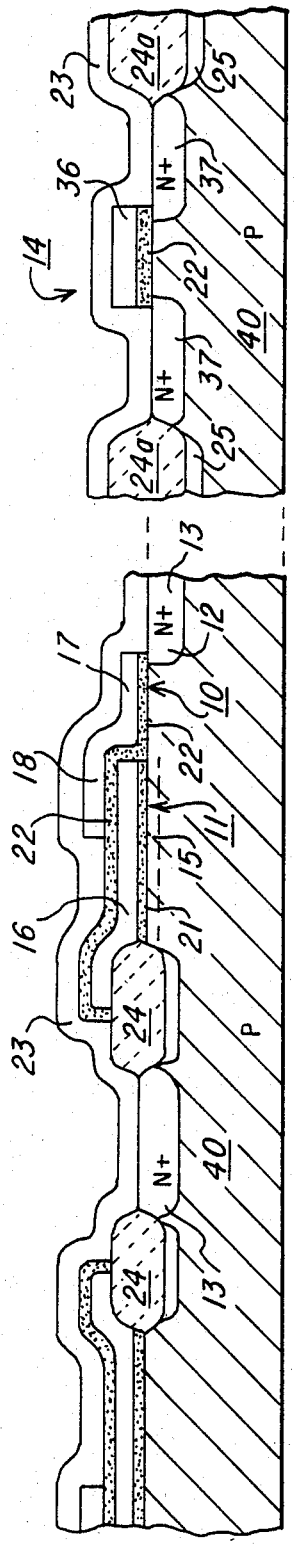
FIGS. 3a-3e are elevation views in section of the cells of FIG. 1, taken along the lines a—a, b—b, c—c, d—d, and e—e respectively.
Figure 3B:
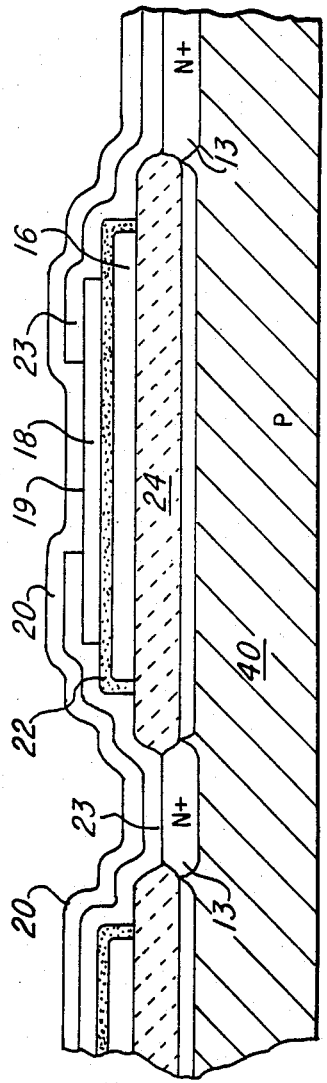
Figure 3C:
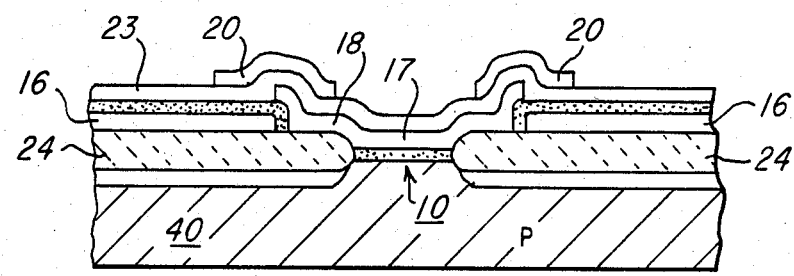
Figure 3D:
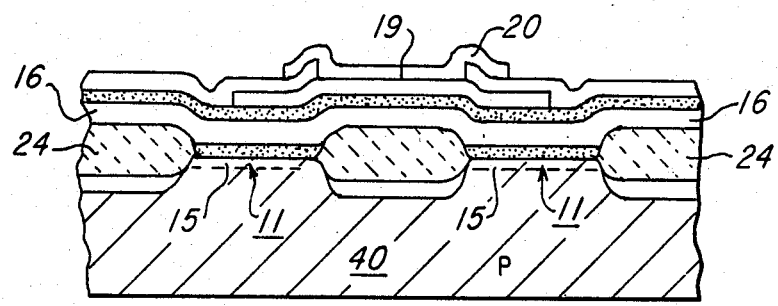
Figure 3E:
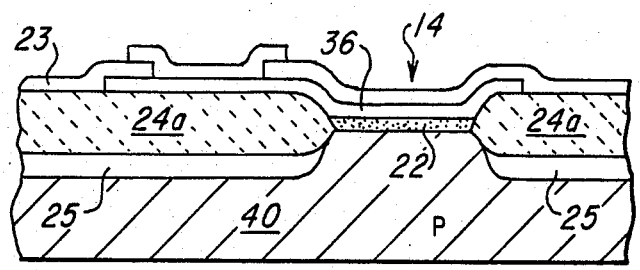

The cell array, of which FIG. 1 is a small part, would typically contain perhaps 64K or 256K cells on a silicon bar which is about 160 mils on a side or about 25,000 sq. mil area, depending upon the bit density. The four cells shown would be on a minute part of the bar, perhaps less than one mil wide. A 64K RAM would require 256 of the X address lines or row lines 20, and 256 of the bit or Y lines 13, providing 65,536 bits. As seen in FIG. 2, the bit lines 13 are connected to opposite sides of a differential sense amplifier which employs a pair of driver transistors 26, 27 and coupling transistors 28, 29; grounding transistors 30 and 31 connect the sources of the driver transistors to Vss at $\Phi$sbi and $\Phi$sb2. Active load devices 32 and 33 connect the bit lines 13 to the supply voltage Vcc which is 5 v in this case. A dummy cell with an access transistor 10$d$, a capacitor 11$d$, and a discharge transistor 10$dc$ is provided on each side of each sense amplifier; when a cell on one side is addressed by a word line 20, a dummy cell address line 34 on the opposite-side is activated. The bit lines 13 are precharged during $\phi$ by transistors 35. This cell array and sense amplifier is shown in Electronics, Sept. 28, 1978, pp. 109–116 and U.S. Pat. No. 4,239,993, by McAlexander, White and Rao, assigned to Texas Instruments.

The peripheral transistor 14, illustrative of hundreds of like devices in the peripheral circuitry where the critical speed paths are present in the memory device, includes a second-level polysilicon gate 36, and N+ source/drain regions 37. A metal line 38 (like the column lines 20) connects to an extended part of the poly gate at a contact area 39. It is important that the conductors overlying the field oxide 24$a$ associated with peripheral transistors 14 have minimum capacitance coupling to the substrate or N+ source/drain regions.

Turning now to FIGS. 4$a$–4$e$, a process for making the DRAM cell array and peripheral circuitry according to the invention will be described. The starting material is a slice of P-type monocrystalline silicon, typically four inches or 100 mils in diameter, cut on the <100> plane, of a resisitivity of about 6 to 8 ohm-cm. Alternatively, the slice may consist of a P+ substrate of about 0.01 to 0.1 ohm-cm resistivity with a P- epitaxial layer of several microns in thickness. As mentioned above, in the FIGURES the portions shown of the bar 40 represent only very small parts of the slice, perhaps about one mil wide. After appropriate cleaning, the slice is oxidized by exposing to oxygen in a furnace at an elevated temperature of perhaps 1000° C. or above to produce an oxide layer 41 over the entire slice of a thickness of about 1000 Å. Next, a layer 42 is silicon nitride of about 1000 Å thickness is formed over the entire slice by exposing to an atmosphere of dichlorosilane and ammonia in a reactor.

A coating of photoresist is applied to the entire top surface of the slice, then exposed to ultraviolet light through a mask which defines the desired pattern of both types of field oxide coating 24 and 24$a$ and the underlying P+ channel stops 25. The resist is developed, leaving areas where nitride is then removed by etching the exposed part of the nitride layer 42 but leaving in place the oxide layer 41. Using photoresist and nitride as a mask, the slice is subjected to an implant step to produce the channel stop regions 25; to this end boron atoms are introduced by ion implant into unmasked regions 43 of silicon as seen in FIG. 4$a$. The regions 43 will not exist in the same form in the finished device, because silicon will be consumed in the field oxidation procedure. Usually the slice is subjected to a heat treatment after the boron implant but prior to field oxide growth, as set forth in my U.S. Pat. No. 4,055,444, assigned to Texas Instruments.

The next step in the process is the formation of dual-thickness field oxide. Initially the slices are subjected to steam or an oxidizing atmosphere at about 900° to 1000° C. for several hours to cause a first thickness of oxide 24 to be grown as seen in FIG. 4$b$, extending into the silicon surface as silicon is consumed. The parts of the nitride layer 42 left on the face of the silicon function to mask oxidation. The thickness of this layer 24 is about 5000 Å, part of which is above the original surface and part below. The boron doped P+ regions 43 formed by implant are partly consumed, but also diffuse further into the silicon ahead of the oxidation front to produce P+ field stop regions 25 much deeper than the original regions 43. At the edges 44 of the nitride 42, a small amount of moat encroachment occurs, generally as discussed in U.S. Pat. No. 4,170,492, assigned to Texas Instruments.

According to one feature of the invention, another layer 42$a$ of silicon nitride is applied to the face of the slice and patterned and etched using photoresist so that it only remains over the memory cell array, not over the periphery, as seen in FIG. 4$c$. The slice is subjected to another high temperature thermal oxidation, producing thicker oxide 24$a$ of about 10,000 Å where not covered by nitride 42 or 42$a$. Moat encroachment occurs to a much greater extent in the areas 45 where this thicker field oxide 24$a$ is grown, whereas no further encroachment occurs at the edges 44. The extent of encroachment of edges 45 would be quite detrimental in the array where line widths of 3 micron or less are needed, because the width destroyed may approach one micron at each edge 45.

Next the remaining nitride layer 42 and 42$a$ is removed by an etchant which attacks nitride but not silicon oxide, then the oxide 41 is removed by etching and the exposed silicon cleaned. The first gate oxide 21 is grown by thermal oxidation to a thickness of about 500 Å as seen in FIG. 4$d$. In areas of the slice where depletion load devices are required, although not pertinent to this invention, a masked ion implant step would be done at this point. Likewise, the threshold voltage of the enhancement mode transistors in the cell array or in the periphery may be adjusted by another ion implant, using photoresist masking.

As seen in FIG. 4$d$, a first layer of polycrystalline silicon is deposited over the entire slice in a reactor using standard techniques to a thickness of about 5000 Å. This layer is doped with phosphorus by an N+ deposition to make it highly conductive. This first level polysilicon layer is patterned by applying a layer of photoresist, exposing to ultraviolet light through a mask prepared for this purpose, developing, then etching the exposed polysilicon to define the capacitor gates or strips 16 in the cell array. No first-level poly is used for the transistor 14 in the segment of the periphery seen in the FIGS. 3$a$ or 3$e$.

The upper surface of the first level polysilicon as well as exposed silicon is oxidized by exposing the slice to an oxidizing atmosphere at 900° to 1000° C. to create the second thin thermal oxide layer 22 over the channels of the transistors 10 and 14 and over the capacitor gates 16 to a thickness of about 500 Å. A second level of polycrystalline silicon is next deposited over the slice using standard techniques, then doped N+ and patterned using photoresist to leave the segments 18 which also form the transistor gates 17, and to leave the gates 36 of the peripheral transistors 14. As seen in FIG. 4$e$, the slice is now subjected to an arsenic implant or phosphorus diffusion to create the N+ regions 12, 13 and 37, masked by the second level poly gates 17 and 36.

A thick layer 23 of silicon oxide is deposited by decomposition of silane at a low temperature, about 400° C. This layer 23 insulates the metal level from the layers of polycrystalline silicon, and is referred to as multilevel oxide.

Referring to FIGS. 1 and 3a-3e, the multilevel oxide layer 23 is now patterned by a photoresist operation, exposing the contact areas 19 and 39 for metal-to-polysilicon contacts along the bit lines 20 and connector 38 (and various other contact areas for metal-to-silicon or metal-to-poly contacts for peripheral devices). Metal contacts and interconnections are used in the periphery of the chip in the input buffers, decoders, sense amplifiers, and the like, as well as for the bonding pads which provide connection to external electrodes. The metal contacts and interconnections such as lines 20 and 38 are made in the usual manner by depositing a thin film of aluminum over the entire top surface of the slice then patterning it by a photoresist mask and etch sequence, leaving the metal strips.

A thick protective oxide layer (not shown) covers the metallization, with aperatures etched in this layer above bonding pads. This layer is non-thermal oxide or nitride/oxide deposited at low temperature in accord with standard MOS manufacturing methods. Usually this covers everything except the bonding pads on a bar.

An alternative to growing additional thermal field oxide 24a for the periphery as described above is to use low-temperature plasma deposited silicon oxide over the thermal oxide 24 of FIG. 4b in the areas where additional thickness 24a is grown as in FIG. 4c. This oxide is deposited over the entire face of the slice then removed from over all moat areas and from over the cell array area using a photoresist etch mask. Alignment or registration of this moat to field oxide mask is critical, however.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A method of making a dynamic semiconductor memory device at a face of a silicon body, including forming an array of one-transistor cells in a cell array area of said face and forming circuits in a peripheral area of said face, comprising the steps of:
    masking said face of the silicon body to expose first field areas of said cell array area and second field areas of said peripheral area, and to cover transistor and capacitor areas, in the cell array area and peripheral area;
    implanting channel-stop impurity into both said first and second field areas,
    growing field oxide to a first thickness in said first and second field areas by exposing said face to an oxidizing atmosphere at high temperature;
    masking said face with an oxidation mask to expose said second field areas and to cover said first field areas;
    growing field oxide to a second thickness in said second field areas by exposing said face to an oxidizing atmosphere at high temperature;
    said field oxide in both said first and second field areas having channel-stop regions beneath the field oxide, said channel-stop regions being of the same conductivity type as said body,
    thereafter forming polycrystalline silicon electrodes in said transistor and capacitor areas to provide capacitors and transistor gates of memory cells and transistor gates of peripheral transistors.

2. A method according to claim 1 wherein the body is P-type silicon, heavily doped N+ regions are formed in said face, and the electrodes include conductive material which is polycrystalline silicon.

3. A method according to claim 1 wherein the step of forming electrodes includes:
    applying a first layer of conductive material over said face of the semiconductor body to form a capacitor electrode overlying a first semiconductor region,
    applying a second layer of conductive material on said face partially overlying the first layer and overlying second and third semiconductor regions,
    applying a metal layer to said face to define at least one elongated strip overlying the first and second layers and making contact to the second layer.

4. A method according to claim 2 wherein said masking is by patterned coatings of silicon nitride.

5. A method according to claim 4 wherein said steps of masking employ separate layers of silicon nitride patterned using photoresist.

6. A method according to claim 5 wherein said body is annealed in an inert atmosphere before the steps of growing field oxide.

7. A method according to claim 3 wherein the second layer is patterned to define a conductor segment for connection to the elongated strip which defines an address line.

8. A method according to claim 7 wherein the first layer is patterned to define a bias gate for the capacitor partially underlying the elongated strip.

9. A method according to claim 8 wherein a thick insulator separates said layer of metal from said face except at a contact window.

10. A method according to claim 9 wherein the coating of field oxide of first thickness formed on said face before applying said first conductive layer covers the face only in the memory cell array area, except in the transistor and capacitor areas.

11. A method according to claim 10 wherein an array of said cells is formed at said face in said array area and the layer of metal includes parallel strips contacting a plurality of cells in columns.

12. A method of making a semiconductor device comprising the steps of:
    masking a face of a silicon body to expose first and second field areas and cover selected areas;
    implanting channel-stop impurity in said first and second field areas, said impurity being of the same type as said body,
    growing thick thermal oxide of a first thickness in said first and second field areas;
    again masking said face with oxidation-resistant mask to expose only the second field areas;
    growing thermal oxide of a second thickness in the second field areas; and
    thereafter forming polycrystalline silicon electrodes in said selected areas to provide circuit elements, at least some of the electrodes being spaced from the thermal oxide in the first area.

13. A method according to claim 12 wherein the silicon body is P type and N type impurity is selectively introduced in said face after said electrodes are formed.

14. A method according to claim 12 wherein said steps of masking employ silicon nitride patterned using photoresist.

15. A method of making a dynamic semiconductor memory device at a face of a silicon body, including forming an array of one-transistor cells in a cell array area of said face and forming circuits in a peripheral area of said face, wherein first silicon oxide regions are formed in said face in said cell array area to isolate said cells from one another, and wherein second silicon oxide regions are formed in said face in said peripheral area of said face to isolate transistors of said circuits from one another, said method characterized in that said second silicon oxide regions are of a field-oxide thickness substantially greater than a first thickness of said first field oxide regions, and that both said first and said second silicon oxide regions have channel-stop regions beneath the silicon oxide, said channel-stop regions being of the same conductivity-type as said body, comprising the steps of:

growing said second field oxide regions to said field-oxide thickness, greater than said first thickness, while said cell array area is masked with an oxidation resistant mask, and after the first and second silicon oxide regions are formed to said thickness, forming polycrystalline silicon electrodes in said cell array area and said peripheral area for said cells and said transistors.

16. A method according to claim 15 wherein said polycrystalline silicon electrodes include capacitor plates and transistor gates in said cell array area.

17. A method according to claim 15 wherein said oxidation resistant mask is silicon nitride.

18. A method according to claim 16 wherein N+ source/drain regions are formed in said faces using said polycrystalline silicon as a mask.

* * * * *